US008334704B2

(12) United States Patent
Lin et al.

(10) Patent No.: US 8,334,704 B2
(45) Date of Patent: Dec. 18, 2012

(54) SYSTEMS AND METHODS FOR PROVIDING A SYSTEM-ON-A-SUBSTRATE

(75) Inventors: Gloria Lin, San Ramon, CA (US); Bryson Gardner, Jr., San Francisco, CA (US); Joseph Fisher, Jr., San Jose, CA (US); Dave Goh, Los Altos, CA (US); Barry Corlett, Brisbane, CA (US); Dennis Pyper, San Jose, CA (US); Amir Salehi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 53 days.

(21) Appl. No.: 12/565,085

(22) Filed: Sep. 23, 2009

(65) Prior Publication Data

US 2010/0213958 A1 Aug. 26, 2010

Related U.S. Application Data

(60) Provisional application No. 61/154,101, filed on Feb. 20, 2009.

(51) Int. Cl.
  *G01R 31/20* (2006.01)
(52) U.S. Cl. ................ 324/754.08; 324/750.3; 361/749; 438/15
(58) Field of Classification Search ............... 324/750.3, 324/754.08, 537, 756.01, 762.06; 361/749, 361/760; 438/14–18
See application file for complete search history.

(56) References Cited

U.S. PATENT DOCUMENTS

| | | | | |
|---|---|---|---|---|
| 4,744,008 A * | 5/1988 | Black et al. | ................... | 361/717 |
| 5,452,182 A * | 9/1995 | Eichelberger et al. | ........ | 361/749 |
| 5,717,556 A * | 2/1998 | Yanagida | ...................... | 361/803 |
| 6,600,222 B1 * | 7/2003 | Levardo | ........................ | 257/686 |
| 7,135,345 B2 * | 11/2006 | Hamren et al. | ................. | 438/17 |
| 2003/0122123 A1 * | 7/2003 | Deng et al. | ....................... | 257/48 |
| 2004/0164393 A1 * | 8/2004 | Fox et al. | ...................... | 257/686 |
| 2005/0225408 A1 * | 10/2005 | Yagisawa et al. | ........... | 333/24 C |
| 2006/0050497 A1 * | 3/2006 | Goodwin | ....................... | 361/803 |
| 2007/0126125 A1 * | 6/2007 | Rapport et al. | ............... | 257/777 |
| 2008/0054261 A1 * | 3/2008 | Song et al. | ..................... | 257/48 |

* cited by examiner

*Primary Examiner* — Arleen M Vazquez
(74) *Attorney, Agent, or Firm* — Novak Druce + Quigg LLP

(57) ABSTRACT

This relates to systems and methods for providing a system-on-a-substrate. In some embodiments, the necessary components for an entire system (e.g., a processor, memory, accelerometers, I/O circuitry, or any other suitable components) can be fabricated on a single microchip in "bare die" form. The die can, for example, be coupled to suitable flash memory through a substrate and flexible printed circuit board ("flex"). In some embodiments, the flex can extend past the substrate, die, or both, to allow additional, relatively large components to be coupled to the flex. In some embodiments, the die can be coupled to the flash memory through the flex and without a substrate. In some embodiments, component test points can be placed on the flash memory side of the substrate.

6 Claims, 9 Drawing Sheets

SYSTEMS AND METHODS FOR PROVIDING A SYSTEM-ON-A-SUBSTRATE

CROSS-REFERENCE TO RELATED APPLICATIONS

This application claims the benefit of U.S. Provisional Patent Application No. 61/154,101, filed on Feb. 20, 2009, which is hereby incorporated by reference herein in its entirety.

FIELD OF THE DISCLOSURE

This relates to systems and methods for providing a system-on-a-substrate. In particular, this relates to systems and methods for reducing the total size of a system's circuitry by providing all of the components of the system on the same microchip.

BACKGROUND OF THE DISCLOSURE

Systems, such as systems for an electronic device, are often created from multiple components. For example, the components of a system can include one or more of a processor, memory (e.g., RAM, SDRAM, DDR RAM, or ROM), CODEC circuitry, Input/Output ("I/O") circuitry, communication circuitry, accelerometers, capacitors, inductors, or any other suitable components. Traditionally, each of these components are a distinct "entity" and can be created on a separate microchip or can be included in a separate package.

To create the circuitry for the entire system, the separate components (e.g., separate microchips) are typically coupled together through a printed circuit board ("PCB") or other suitable medium. The PCB can be fabricated with the appropriate wiring or routing to suitably connect all of the separate components.

SUMMARY OF THE DISCLOSURE

This relates to systems and methods for providing a system-on-a-substrate. For example, rather than including the components of a system as discrete entities (e.g., as discrete microchips or as discrete parts), the components of a system can be formed together in "bare die" form. In other words, the components can be formed together on a single substrate, such as a silicon die or a die of other suitable material. In this manner, the components of an entire system can be densely and efficiently packed together, thus allowing the system to achieve a smaller size than a system using components that are discrete entities.

The components can include, for example, one or more of a processor, memory (e.g., RAM, SDRAM, DDR RAM, ROM), CODEC circuitry, Input/Output ("I/O") circuitry, communication circuitry, accelerometers, capacitors, or any other suitable components. A system utilizing these components can be included in any suitable electronic device such as, for example, a cellular telephone, a personal data assistant ("PDA"), a digital media player (e.g., an iPod™ available from Apple Inc. of Cupertino, Calif.), a computer, or any other suitable electronic device.

In some embodiments, a die including the components of a system can be coupled to a substrate. The substrate, in turn, can be coupled to a flexible printed circuit board ("flex"). The substrate and the flex can include any suitable wiring and routing to electrically couple the die to other parts of the system such as, for example, a flash memory. In some embodiments, the flex can be coupled to a different surface of the substrate than the die. In some embodiments, the flex can be coupled to the same surface of the substrate as the die.

In some embodiments, the flex can include a ledge to which one or more components can be coupled. In some embodiments, a system can be created which does not include a substrate. In this case, all necessary wiring can be provided through the flex. In some embodiments, test points can be provided for a component of a die. For example, the test points can be included in a portion of the flex located substantially below the component to be tested.

In some embodiments, rather than being included together in a single die, the components of a system can be included as discrete entities. The discrete entities can be coupled to a substrate rather than being coupled to a printed circuit board ("PCB"). As a substrate can have more stringent design rules than a PCB, coupling the discrete entities to the substrate can allow for a system that is smaller and more compact in size. For example, the wiring for the system can be created using less layers and can be formed more densely in a substrate than in a PCB.

BRIEF DESCRIPTION OF THE DRAWINGS

The above and other advantages of the invention will be apparent upon consideration of the following detailed description, taken in conjunction with accompanying drawings, in which like reference characters refer to like parts throughout, and in which.

DETAILED DESCRIPTION OF THE DISCLOSURE

Generally, a system can be made up of several different components. As used herein, the term "component" can refer to any suitable part or constituent of a system such as, for example, one or more of a processor, memory (e.g., RAM, SDRAM, DDR RAM, ROM), CODEC circuitry, Input/Output ("I/O") circuitry, communication circuitry, accelerometers, capacitors, or any other suitable components. Each of these components can generally be fabricated on their own, distinct microchip or fabricated as a discrete and distinct "entity". For example, the processor of a system may be on one microchip, the memory of the system may be on a different microchip, and a capacitor may be a separate entity from both the processor microchip and the memory microchip. As used herein, the term "entity" can refer to a component when it is included in a system as a discrete, pre-packaged part or microchip.

In this manner, all of the system components can be discrete and generally pre-packaged entities. To create a system with an entire set of components, these separate entities can be coupled together through, for example, a printed circuit board ("PCB") or other suitable medium. A PCB can generally be a rigid board that is formed from one or more dielectric layers. The dielectric layers can be designed with contacts to electrically couple the PCB to the components (e.g., to the discrete microchips) and designed with various conductive pathways to electrically couple the various components to each other.

Figure 1:
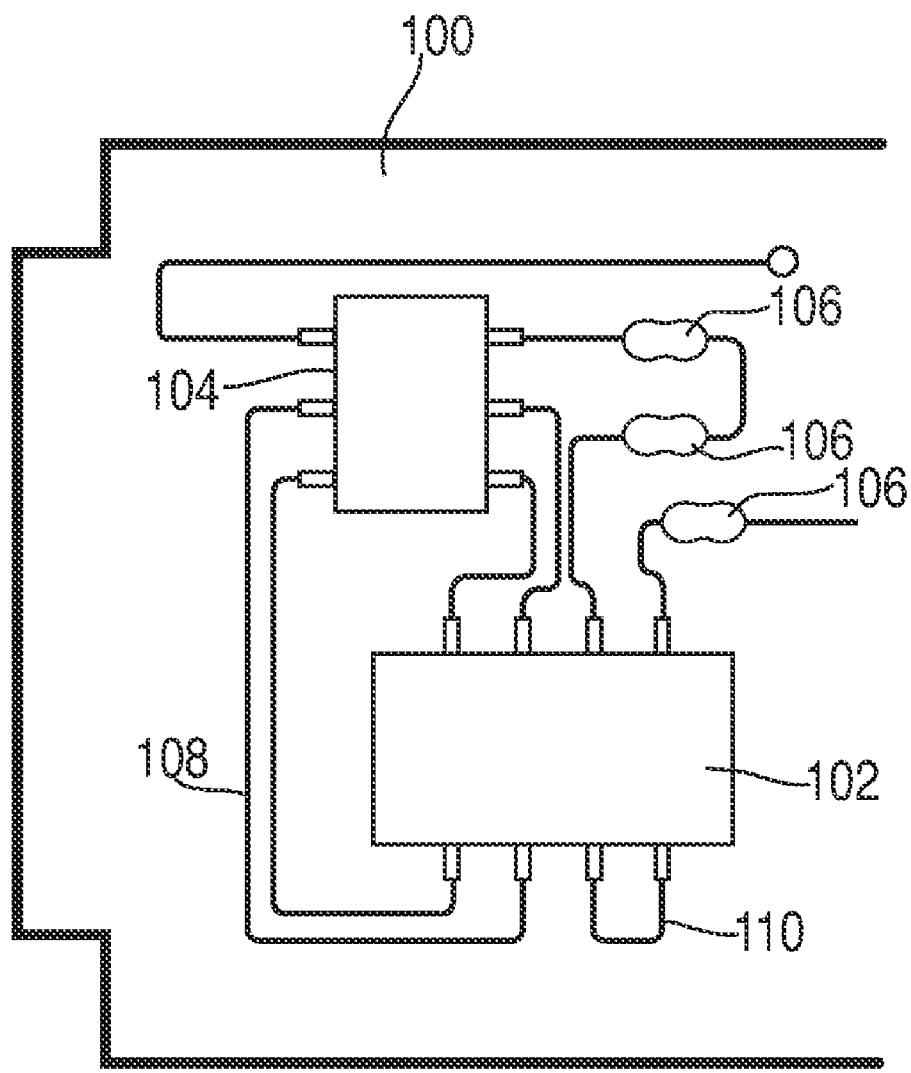
FIG. 1 is an illustrative printed circuit board system.

FIG. 1 shows an illustrative PCB 100 that can be used for coupling together the components of system 10, when the components are each discrete entities. For example, discrete entities such as a processor microchip 102, memory microchip 104, and one or more capacitors 106 can be coupled together through PCB 100. PCB 100 can be formed with conductive pathways or wiring (e.g., wiring 108 or 110) that can suitably provide electrical connections between the various entities of system 10 to couple the entities together.

Although FIG. 1 illustrates a processor, memory, and capacitors, one skilled in the art could appreciate that one or more of the above-mentioned discrete entities (e.g., CODEC circuitry, I/O circuitry, communication circuitry, accelerometers, or any other suitable components) could alternatively or additionally be illustrated in FIG. 1. As used herein, when a specific illustration of a component is provided, one skilled in the art could appreciate that the specific illustration is given merely for illustration and not for limitation, and that any other suitable component (e.g., a processor, a memory, CODEC circuitry, I/O circuitry, communication circuitry, accelerometers, capacitors, or any other suitable component), could alternatively or additionally have been illustrated.

As mentioned above, a PCB (e.g., such as PCB 100 of FIG. 1) can generally couple together the various components or entities for an entire system of an electronic device. For example, the PCB may couple together the necessary entities for a system used in a cellular telephone, a personal data assistant ("PDA"), a digital media player (such as an iPod™ available from Apple Inc. of Cupertino, Calif.), a computer, or any other suitable electronic device. Because the components of the system are each formed as their own, discrete entities and are generally pre-packaged instances, the minimum size of the system can be significantly constrained by the discrete entities. As one example, the use of the discrete entities may cause difficulties in routing the wiring between the entities, thus requiring additional wiring and space to effectively couple the entities together. As another example, because they are generally pre-packaged entities and cannot be altered, the size of the entities may not be decreased. These limitations may, in turn, limit how small in size the electronic device that is utilizing the system can become.

Figure 2A:
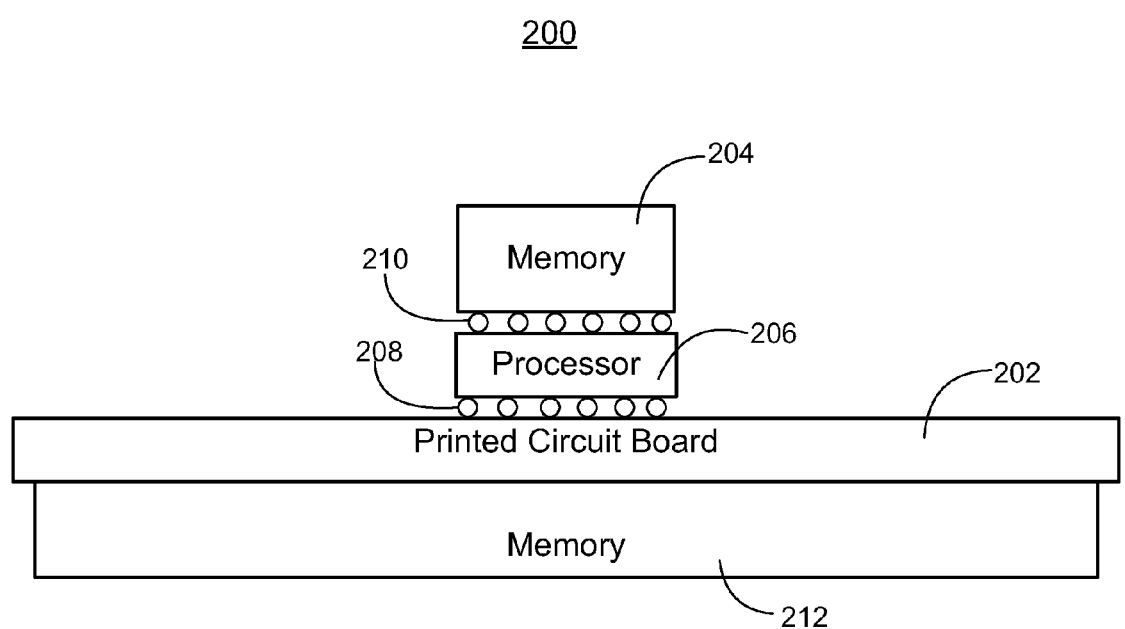
FIG. 2A is an illustrative system including multiple components mounted on a printed circuit board.

FIG. 2A shows a side-view of a system 200 that can include components that are each discrete entities (e.g., discrete microchips, discrete parts, or both). System 200 can include PCB 202 that can be used for coupling together the discrete entities of system 200. For example, PCB 202 can correspond to PCB 100 of FIG. 1. In some embodiments, rather than being placed side-by-side, the discrete entities of a system may need to be placed on top of one another. For example, FIG. 2A shows memory microchip 204 that can be placed on processor microchip 206. Similar to FIG. 1, although a memory microchip and a processor microchip are illustrated in FIG. 2A, one skilled in the art could appreciate that any other suitable components could alternatively or additionally have been illustrated.

Memory microchip 204 and processor microchip 206 can be coupled to one another and to PCB 202 through any suitable method. For example, they may be coupled to one another through any suitable Surface Mount Technology, such as a Pin Grid Array ("PGA"), Land Grid Array ("LGA"), or Ball Grid Array ("BGA"). For example, solder balls such as one or more solder balls 208 can be used to couple processor microchip 206 to PCB 202 and one or more solder balls 210 can be used to couple memory microchip 204 to processor microchip 206 through a Ball Grid Array.

In some embodiments, a flash memory or any other suitable memory may also be used by the system. For example, a flash memory such as a NAND gate based flash memory may be used. In this case, the NAND memory can also be coupled to the PCB. For example, FIG. 2A illustrates memory 212 that can be coupled to the bottom surface of PCB 202. Similar to the discrete components (e.g., memory microchip 204 and processor microchip 206), memory 212 can be coupled to PCB 202 through any suitable method or Surface Mount Technology.

Due to the stacking of the discrete entities on top of each other (e.g., such as memory microchip 204 stacked on top of processor microchip 206), the minimum size of the total circuitry of the system may additionally be limited in the z-direction (i.e., in the height of the system) by this stacking. Thus, the use of discrete entities (e.g., discrete microchips) to create the system may limit the minimum size that the system can achieve in both the x-y direction (i.e., the surface area) and in the z-direction (i.e., the height). This may, in turn, once again limit the minimum size that an electronic device utilizing the system can achieve.

Figure 2B:
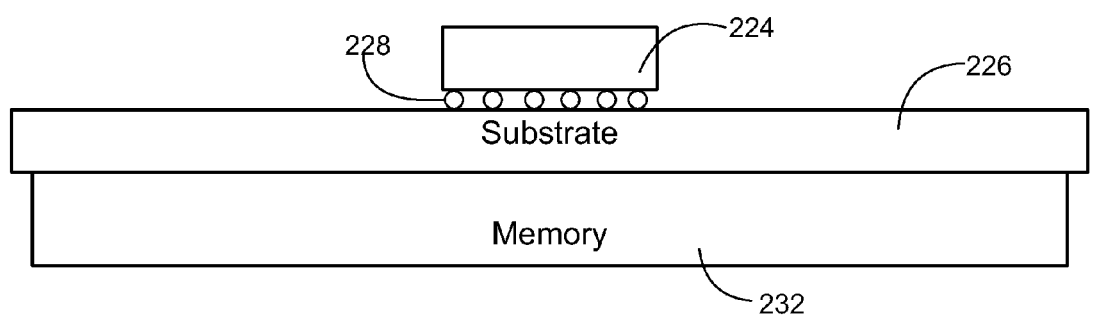
FIG. 2B is an illustrative system including multiple components mounted on a substrate in accordance with some embodiments of the invention.

In some embodiments, the discrete entities of a system (e.g., discrete microchips, discrete parts, or both) can be coupled to a substrate rather than being coupled to a PCB. For example, FIG. 2B shows system 220 in which one or more entities 224 can be coupled to substrate 226. Each entity 224 can include any suitable discrete entity such as a processor, memory, CODEC circuitry, an accelerometer, a capacitor, an inductor, or any other suitable components or combination of components of system 220. Moreover, only one instance of entity 224 is illustrated in FIG. 2B for the purpose of simplicity. However, system 220 can alternatively include any other suitable number of instances of entity 224. In some embodiments, memory 232 can be coupled to a surface of substrate 226. Memory 232 can include, for example, a flash memory (e.g., a NAND gate based flash memory) or any other suitable memory.

Each entity 224 can be coupled to substrate 226 through any suitable method or Surface Mount Technology. By coupling the components of system 220 to substrate 226 rather than to a PCB, the usage of a PCB in system 220 can be limited or even eliminated. Limiting or eliminating the usage of a PCB in a system can beneficially reduce the size of that system. For example, a substrate may have more stringent design rules than a PCB, thus allowing the wiring through the substrate to be denser. This, in turn, can provide for a system in which distinct entities are mounted to a substrate to achieve a smaller size than a system in which the distinct entities are mounted to a PCB. For example, a PCB may have design rules requiring traces that are at least 60 micrometers in width and requiring at least 60 micrometers in between traces, while a substrate may have design rules requiring traces that are at least 15 micrometers in width and requiring at least 15 micrometers in between traces. Accordingly, in this scenario, a substrate can achieve wiring that is 4 times denser than the wiring of a PCB. In some embodiments, by mounting discrete entities to a substrate, for example, a 4-layer, 0.2-millimeter thick substrate can be used in place of a 6-layer, 0.5-millimeter thick PCB.

In some embodiments, rather than using discrete, separate entities for the various components of a system, the components of a system can be formed together in a single microchip. For example, if the components of a system are a processor, memory, I/O circuitry, accelerometer, and various capacitors, all of these components can be formed together in "bare die" form (e.g., the components can be created on a single substrate, such as a silicon die or a die of other suitable material). This can allow all of the components of the system to be integrated tightly together on one microchip, thus significantly reducing the achievable size of the total circuitry of the system. Thus, rather than multiple microchips on a PCB, the entire system can all be formed in bare die form on a single microchip. This "system-on-a-substrate" can result in the same functionality for the system while greatly reducing the system in size (e.g., the size can be reduced by 40-80%, by 50-70%, by 55-65%, or by 60%).

Figure 3:
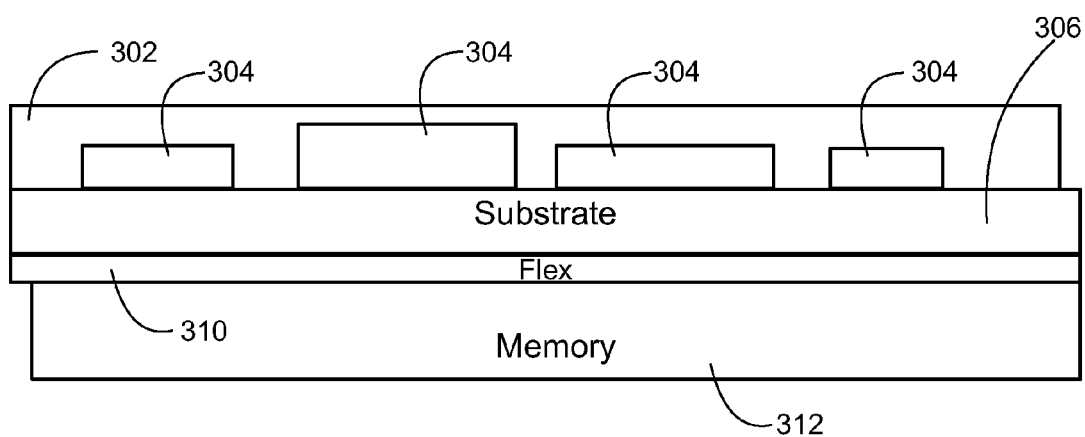
FIG. 3 is an illustrative system-on-a-substrate in accordance with some embodiments of the invention.

FIG. 3 shows an illustrative system-on-a-substrate 300. System-on-a-substrate 300 can include die 302. Die 302 can be fabricated to include any or all of the components of an entire system, such as one or more of components 304. For example, each component 304 can include any of the necessary circuitry to form one or more processors, memory, CODEC circuitry, I/O circuitry, communication circuitry, accelerometers, capacitors, inductors, or any other suitable components. Although each of components 304 are illustrated as separate blocks in FIG. 3, because the components are fabricated into the same die, in some embodiments components 304 can overlap with or go through one another. For example, transistor gates, wiring, or both of one component can be fabricated in the same transistor gates and wiring of another component. Accordingly, because each of components 304 can be fabricated on the same die 302, the components can be tightly integrated and densely formed, thus significantly reducing the overall size of system 300.

In some embodiments, die 302 can be electrically coupled to substrate 306. In some embodiments, there can be a flexible printed circuit board ("flex") 310 coupled to the opposite side of substrate 306 as die 302. Flexible printed circuit boards can include multiple layers (e.g., of wiring levels) and can be used, for example, to provide wiring and electrical connections between one board to another board, one board to a microchip, or from one microchip to another microchip. Flexible printed circuit boards are generally lighter, thinner, and more ductile than a PCB, and can be beneficial to use in systems having limited space. In some embodiments, flex can be used without a substrate to support a die.

Flex 310 can include multiple layers (e.g., two layers of wiring, three layers of wiring, or any suitable number of layers of wiring). Flex 310 and substrate 306 can be used to provide the necessary wiring and routing to connect entities 304 to one another and/or connect die 302 to any suitable type of memory, such as flash memory. For example, substrate 306 and flex 310 can connect die 302 to memory 312.

Figure 4:
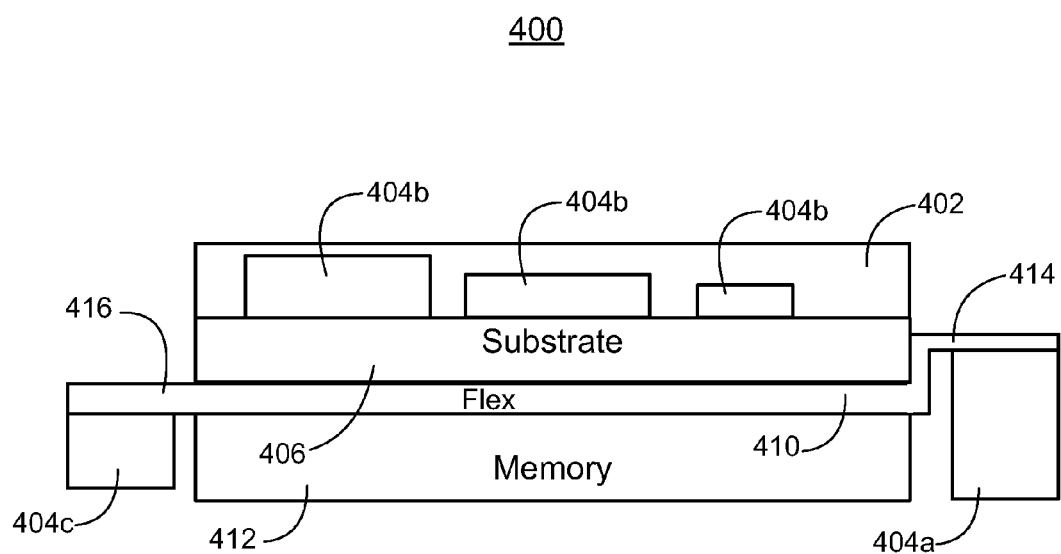
FIG. 4 is an illustrative system-on-a-substrate including a ledge in accordance with some embodiments of the invention.

In some embodiments, flex 310 can include a ledge that extends beyond memory 312, die 302, or both. In this case, rather than being fabricated in die 302, one or more components can be coupled to this ledge. For example, FIG. 4 shows illustrative system-on-a-substrate 400 that can include ledge 414 in accordance with some embodiments. Similar to system-on-a-substrate 300, system-on-a-substrate 400 can include flex 410 that can be coupled to substrate 406 and memory 412.

In some embodiments, at least one component 404a can be coupled to ledge 414. This design can be beneficial when, for example, component 404a is a relatively large component such as a large capacitor or other large component. For example, if component 404a is taller than the height of die 402, by coupling component 404a to ledge 414 instead of including it within die 402 along with the other components (e.g., components 404b), the height of system-on-a-substrate 400 may be significantly reduced. By reducing the height of system-on-a-substrate 400, the size of an electronic device that utilizes system-on-a-substrate 400 may also be significantly reduced. In some embodiments, rather than being vertically offset from flex layer 410, a ledge such as ledge 416 may alternatively be aligned vertically with flex layer 410. Ledge 416 may, for example, couple to a component such as component 404c.

Figure 5:
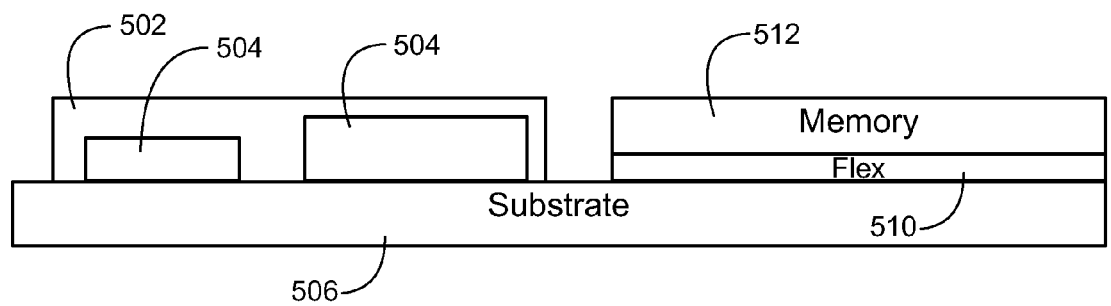
FIGS. 5, 6, 7A, and 7B are illustrative systems-on-a-substrate in accordance with some embodiments of the invention.

In some embodiments, rather than being on the opposite side of the substrate from the components, the memory (e.g., NAND memory, or any other suitable memory) can alternatively or additionally be on the same side of the substrate as the components. For example, FIG. 5 shows substrate 506 that can have die 502 (e.g., including one or more components 504) coupled to a single side of the substrate. Memory 512 can also be coupled to the same side of substrate 506 (e.g., through flex 510) as die 502. In some embodiments, die 502, memory 512, or both, may have portions of themselves coupled to each side of substrate 506 (not shown).

Figure 6:
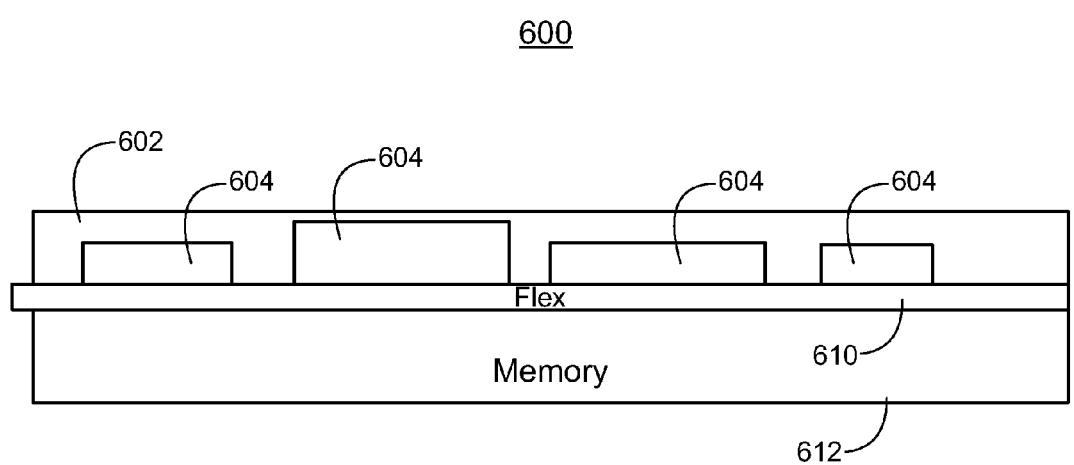

In some embodiments, a system-on-a-substrate can be created without a substrate layer. Instead, all of the necessary wiring and routing can be done through a flexible printed circuit board. For example, FIG. 6 shows system-on-a-substrate 600 that includes die 602 and memory 612 coupled together solely through flex 610. Die 602 can include one or more entities 604 and memory 612 can be included on either or both sides of flex 610.

In some embodiments, component test points can be added to a system. The component test points may allow a person to perform tests on a microchip after the microchip has been fabricated. For example, the test points can be used to perform failure analysis, performance analysis, or any other suitable testing on the entire microchip or on portions of the microchip.

Figure 7A:
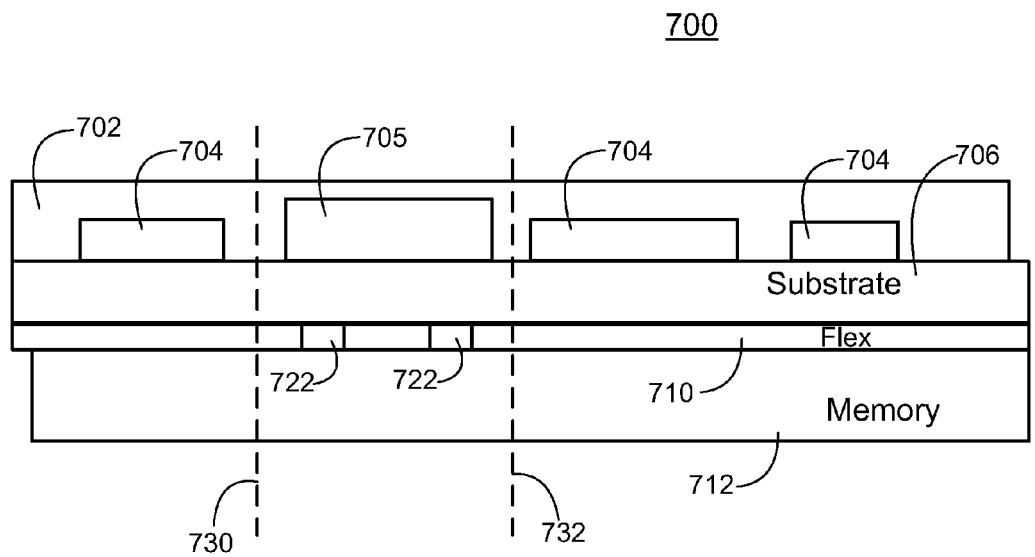

FIG. 7A shows system 700 that can include one or more test points 722. In some embodiments, test points 722 can be positioned in a manner that allows them to be used for testing one or more components (e.g., components 704 and/or component 705) that can be fabricated in die 702. For example, test points 722 can be placed in positions near or underneath component 705, (or any other suitable component, to allow for testing of that component. In some embodiments, some or all of test points 722 can be placed on the side of substrate 706 that faces memory 712. Placing test points on the memory side of a substrate, as opposed to placing test points adjacent to the component being tested (e.g., component 705), can allow for testing of that component while causing less damage to the component. In this scenario, a portion of flex 710 can be removed to form a gap in flex 710, and one or more test points 722 can be included in that gap.

Figure 7B:
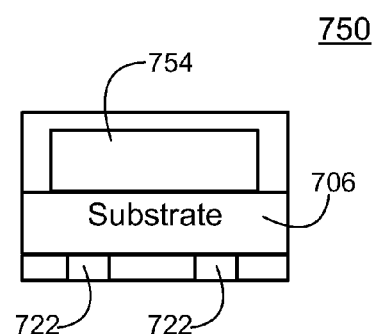

In some embodiments, to perform testing on component 704, component 704 can be removed from system 700. For example, component 704 can be removed by cutting through die 702 and around component 704 along lines 730 and 732. Memory 712 can then be decoupled from flex 710. This can allow test points 722 to be easily accessed when performing testing of the component. For example, FIG. 7B shows portion 750 after component 754 has been cut out and the memory has been decoupled, thus resulting in easily accessible test points 722. In this manner, test points 722 can be exposed on a surface of portion 750 to allow, for example, a test probe or other suitable testing device to come into contact with one or more of test points 722.

Figure 8:
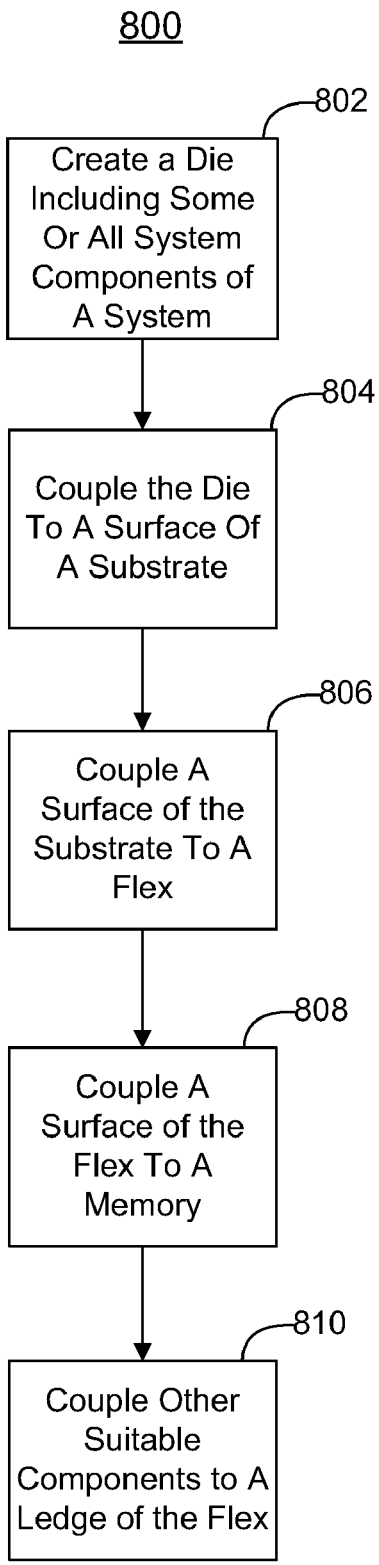
FIG. 8 is an illustrative process for creating a system-on-a-substrate in accordance with some embodiments of the invention.

FIG. 8 shows illustrative process 800 for creating a system-on-a-substrate. At step 802, a die can be created that includes some or all of the various components of a system. The components can include, for example, a processor, memory, CODEC circuitry, Input/Output ("I/O") circuitry, communication circuitry, accelerometers, capacitors, any other suitable components, or any combination of the above. As all of the components of the system can be created in the same die, in some embodiments the components can overlap with or go through one another. The die can include, for example, a silicon die or a die of any other suitable material.

At step 804, the die can be coupled to a surface of a substrate. At step 806, a surface of the substrate can be coupled to a flexible circuit board ("flex"). The flex and the substrate may, for example, be used to provide the wiring and routing to couple the die to any other suitable entities in the system. In some embodiments, as illustrated in FIG. 3, the die and the flex can be coupled to different surfaces of the substrate. In some embodiments, as illustrated in FIG. 5, the die and the flex can be coupled to the same surface of the substrate.

At step 808, a surface of the flex can be coupled to a memory. In turn, the flex and the substrate can provide the necessary wiring and routing to electrically couple the memory to the die. The memory can include, for example, a flash memory (e.g., a NAND gate-based flash memory) or any other suitable memory.

At step 810, other suitable components can be coupled to a ledge of the flex. For example, the flex can include a ledge such as ledge 414 of FIG. 4. A component can then be coupled to the ledge, such as component 404a or 404c of FIG. 4. The ledge may be vertically offset from the flex or vertically aligned with the flex. The component can include, for example, a component that is relatively large in comparison to the die or in comparison to the system. In this manner, by coupling the component to the ledge rather than including it in the die, a system can be created that is potentially smaller in the z-direction (e.g., in height).

The process discussed above is intended to be illustrative and not limiting. Persons skilled in the art can appreciate that steps of the process discussed herein can be omitted, modified, combined, or rearranged, or that any combination of these steps or any additional steps can be performed without departing from the scope of the invention. For example, in some embodiments, a substrate can be eliminated and a die can be coupled directly to the flex. In this scenario, step 804 of process 800 can be omitted, and step 806 can modified such that a surface of the die is coupled to the flex. As another example, in some embodiments step 810 can be omitted and a system-on-a-substrate can be created that does not include components coupled to a ledge of the flex.

Various configurations described herein may be combined without departing from the invention. The above described embodiments of the invention are presented for purposes of illustration and not of limitation. The invention also can take many forms other than those explicitly described herein. For example, in addition to or instead of coupling a flex to a memory (e.g., memory 312 of FIG. 3, memory 412 of FIG. 4, memory 512 of FIG. 5, memory 612 of FIG. 6, or memory 712 of FIG. 7), the flex can be coupled to a component (e.g., a component not included in a die). Accordingly, it is emphasized that the invention is not limited to the explicitly disclosed methods, systems, and apparatuses, but is intended to include variations to and modifications thereof which are within the spirit of this disclosure.

What is claimed is:

1. A method for creating a system, the method comprising:
   coupling a microchip to a first surface of a substrate, wherein the microchip comprises every system component of the system;
   coupling a second surface of the substrate to a flexible printed circuit board ("flex");
   coupling at least one test point to at least one system component of the microchip, wherein the test point is operable to indicate the quality of the at least one system component; and
   separating a first portion of the system from a remaining portion of the system, wherein the first portion comprises the at least one test point and the at least one system component.

2. The method of claim 1, further comprising coupling the flex to an entity, wherein the flex and the substrate electrically couple the microchip to the entity.

3. The method of claim 2, where the entity comprises a flash memory.

4. The method of claim 1, wherein the at least one test point is positioned in the flex.

5. The method of claim 1, wherein the first portion further comprises a memory component coupled to the at least one test point.

6. The method of claim 5, further comprising decoupling the memory component from the at least one test point, wherein the decoupling allows the at least one test point to be accessed by a test probe.

\* \* \* \* \*